United States Patent [19]

Inahashi

[11] Patent Number: 5,266,906
[45] Date of Patent: Nov. 30, 1993

[54] LINEAR AMPLIFIER PERFORMING DISTORTION COMPENSATION CONTROL

[75] Inventor: Atsushi Inahashi, Saitama, Japan
[73] Assignee: NEC Corporation, Tokyo, Japan
[21] Appl. No.: 968,484
[22] Filed: Oct. 29, 1992
[30] Foreign Application Priority Data Oct. 29, 1991 [JP] Japan .................. 3-282477

[51] Int. Cl.[5] .................. H03F 1/32
[52] U.S. Cl. .................. 330/149; 328/162; 330/52
[58] Field of Search .......... 330/52, 149; 328/162; 332/123, 162; 375/51, 60; 455/50.1, 63, 126

[56] References Cited

U.S. PATENT DOCUMENTS 4,329,655 5/1982 Nojima et al. .................. 330/149

FOREIGN PATENT DOCUMENTS 56-53881 12/1981 Japan .

OTHER PUBLICATIONS

Toshio Nojima et al., "TWT Amplifier Linearization by Synthesizing Complex Predistortion", Bulletin MW77-100, The Institute of Electronics and Communication Engineers of Japan, pp. 87-94, Dec. 1978.
Toshio Nojima et al., "Predistortion Nonlinear Compensator for Microwave SSB-AM System", Bulletin '84/1 vol. J67-B No. 1, The Institute of Electronics and Communication Engineers of Japan, pp. 78-85, Jan. 1984.

Primary Examiner—James B. Millins
Attorney, Agent, or Firm—Sughrue, Mion, Zinn, Macpeak & Seas

[57] ABSTRACT

A linear amplifier performing a continuous distortion compensation control without no line cut to prevent deterioration of intermodulation distortion and ensure talking quality including a power amplifier for amplifying a plurality of carriers and a distorter for generating an intermodulation distortion with an equal amplitude of an antiphase for negating an intermodulation distortion generated by the power amplifier. A processing unit outputs an attenuation value control voltage and a phase control voltage to the distorter depending on an ambient temperature information detected by a temperature sensor and control voltage data corresponding thereto, read out of a memory.

3 Claims, 5 Drawing Sheets

LINEAR AMPLIFIER PERFORMING DISTORTION COMPENSATION CONTROL

BACKGROUND OF THE INVENTION

The present invention relates to a linear amplifier performing a distortion compensation control, and more particularly to a predistortion linear amplifier which amplifies a plurality of carriers in common and uses a predistortion system to be used in a radio transmitter transmission system requiring a class A operation as an operating area with the elapse of time.

DESCRIPTION OF THE RELATED ARTS

There is shown a conventional linear amplifier using a predistortion system of this kind in FIG. 1, which comprises an input terminal 1 for a plurality of composite carriers, a power amplifier 5, a pilot oscillator 2 for generating a two waves pilot signal to be used for monitoring an intermodulation distortion component of the power amplifier 5, a switch 3 for selecting the carriers or the pilot signals, a distorter 4 for generating an intermodulation distortion with an equal amplitude of an antiphase for negating the intermodulation distortion generated by the power amplifier 5, a detector 6 for detecting the intermodulation distortion generated by the power amplifier 5, an output terminal 7 for a power-amplified carrier, a receiver 8 for receiving a frequency generated by any intermodulation distortion and converting it into a DC voltage to output an intermodulation distortion detection voltage 19, a processing unit 90 for outputting an attenuation value control voltage 10 and a phase control voltage 11 to the distorter 4 so that the detected intermodulation distortion detection voltage 19 may be minimum, and a timer 13 for outputting a distortion compensation start signal 20 to the processing unit 90.

Next, the operation of this conventional linear amplifier will be described.

First, at an initial operation time, the processing unit 90 outputs a loop switch signal 12 to the switch 3 so as to form a feedback loop of the pilot oscillator 2-the switch 3-the distorter 4-the power amplifier 5-the detector 6-the receiver 8-the processing unit 90-the distorter 4 and cuts a line to start a distortion compensation control operation. That is, a two waves high-frequency signal generated by the pilot oscillator 2 is passed through the distorter 4 and then is linearly amplified in the power amplifier 5.

On the other hand, at the output terminal of the power amplifier 5, in addition to the two waves signal, an intermodulation distortion is appeared due to a nonlinear operation of the power amplifier 5. A spectrum output from the pilot oscillator 2 is shown in FIG. 2A, and another spectrum generated at the output terminal of the power amplifier 5 is shown in FIG. 2B.

The receiver 8 detects a certain intermodulation distortion component from the detector 6 and outputs the intermodulation distortion detection voltage 19 to the processing unit 90. Then, the processing unit 90 outputs the attenuation value control voltage 10 and the phase control voltage 11 to the distorter 4, and the distorter 4 generates an optimum intermodulation distortion with the equal amplitude of the antiphase for negating the intermodulation distortion generated in the power amplifier 5.

As to the system of the distorter 4, a method by using "TWT amplifier Linearization by Synthesizing Complex Predistortion", Bulletin MW77-100, Institute of Electronics and Communication Engineers of Japan, or the like can be given.

FIG. 2C shows a spectrum generated at the output terminal of the distorter 4. In this case, a spectrum with an equal amplitude of an antiphase is shown by an arrow in the opposite direction. The intermodulation distortion with the equal amplitude of the antiphase, generated at the output terminal of the distorter 4 can negate the intermodulation distortion generated by the power amplifier 5, and thus the spectrum with a reduced intermodulation distortion is output from the output terminal 7. The spectrum at the output terminal 7 after the distortion compensation in this feedback system is shown in FIG. 2D.

After finishing the distortion compensation operation, the processing unit 90 outputs the loop switch signal 12 to the switch 3 so as to allow the switch 3 to carry out a switch operation to release the feedback loop and to connect the cut line during the distortion compensation operation. At this time, the carrier is flowed along a path of the input terminal 1-the switch 3-the distorter 4-the power amplifier 5-the detector 6-the output terminal 7 and hence a talking quality with a less influence of the intermodulation distortion can be obtained.

The distortion compensation set value optimized by the distortion compensation control by the feedback operation is kept to be held until the timer 13 for sending the signal at an expected time for a large temperature change in advance outputs the distortion compensation start signal 20 to the processing unit 90. After this, only when the processing unit 90 receives the distortion compensation start signal 20 from the timer 13, the distortion compensation control is performed and the optimized distortion compensation set value obtained is kept to be held at each time.

In this conventional distortion compensation control system, the optimum distortion compensation value meeting an ambient temperature and other external factors can be obtained. However, in turn, when the ambient temperature is changed in a period before coming in the next distortion compensation operation, the intermodulation distortion is deteriorated and hence a bad influence is given to the talking quality on the other lines.

Also, in the conventional system, since the feedback loop must be formed at the distortion compensation time, the line must be temporarily cut and hence a network service is lowered.

Further, in the conventional system, since the feedback loop must be formed, the circuit construction becomes complicated and thus a fall of a reliability (MTBF) is caused. Also, the system becomes a high cost and is not economical.

SUMMARY OF THE INVENTION

It is therefore an object of the present invention to provide a linear amplifier performing a distortion compensation control in view of the aforementioned defects of the prior art, which is capable of improving talking quality and reliability, performing a continuous distortion compensation control having no line cut and less deterioration with the passage of time and preventing a deterioration of an intermodulation distortion and a temporary cut of a line, and which has a simple and low cost structure.

In accordance with one aspect of the present invention, there is provided a predistortion linear amplifier, comprising power amplifier means for performing a linear amplification of a plurality of carriers and generating a first intermodulation distortion; distorter means for generating a second intermodulation distortion with an equal amplitude of an antiphase with respect to the first intermodulation distortion generated by the power amplifier means; processing unit means for outputting a control signal for controlling an amplitude amount and a phase amount of the second intermodulation distortion generated by the distorter means; temperature sensor means for detecting an ambient temperature to output temperature information; and memory means for storing a plurality of control voltages having optimum distortion compensation values depending on the ambient temperatures, the processing unit means reading a corresponding control voltage out of the memory means depending on the temperature information output by the temperature sensor means and outputting the read control voltage as the control signal to the distorter means.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENT

Figure 3:
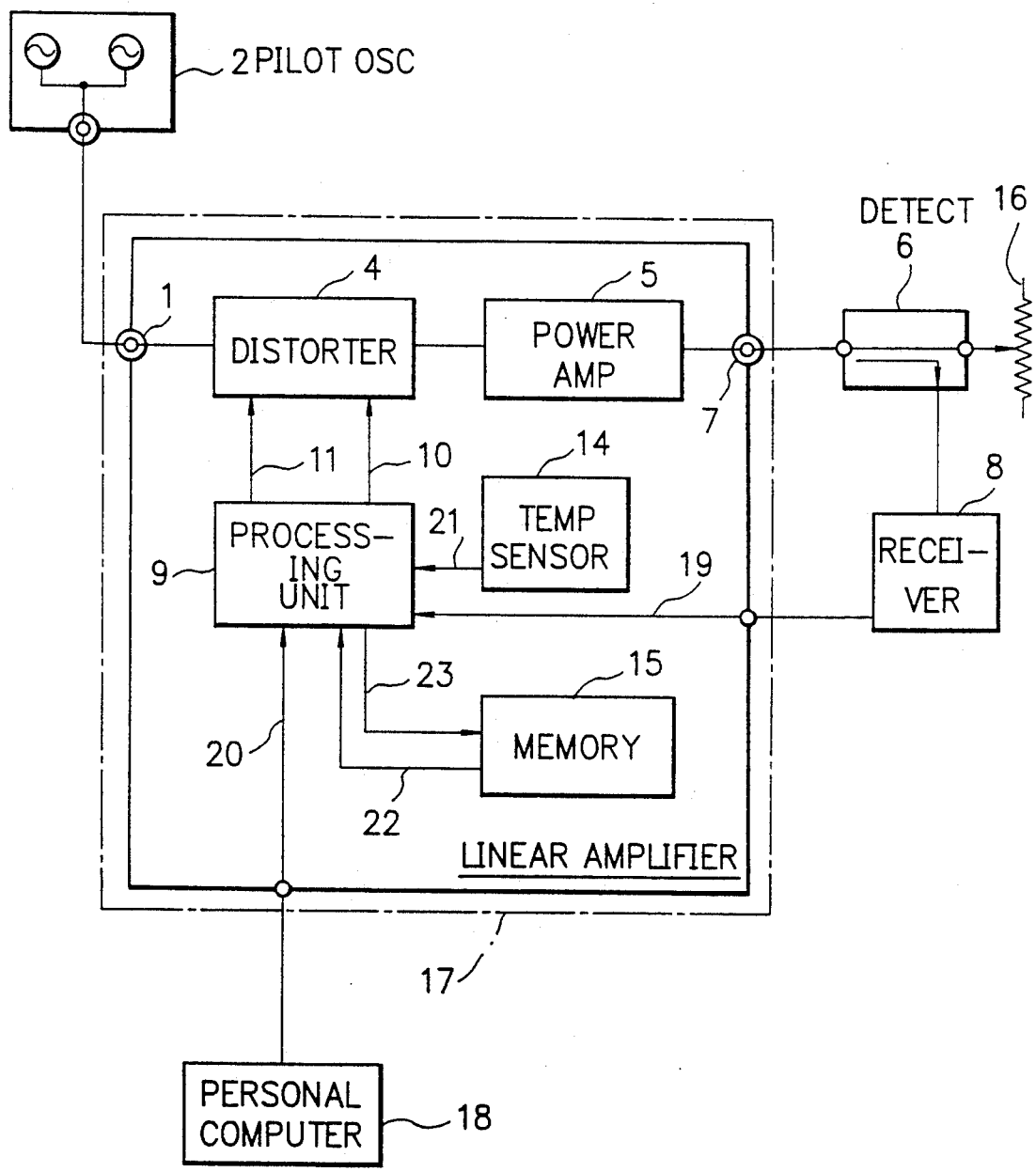
FIG. 3 is a block diagram of a linear amplifier performing a distortion compensation control according to the present invention.
Figure 4:
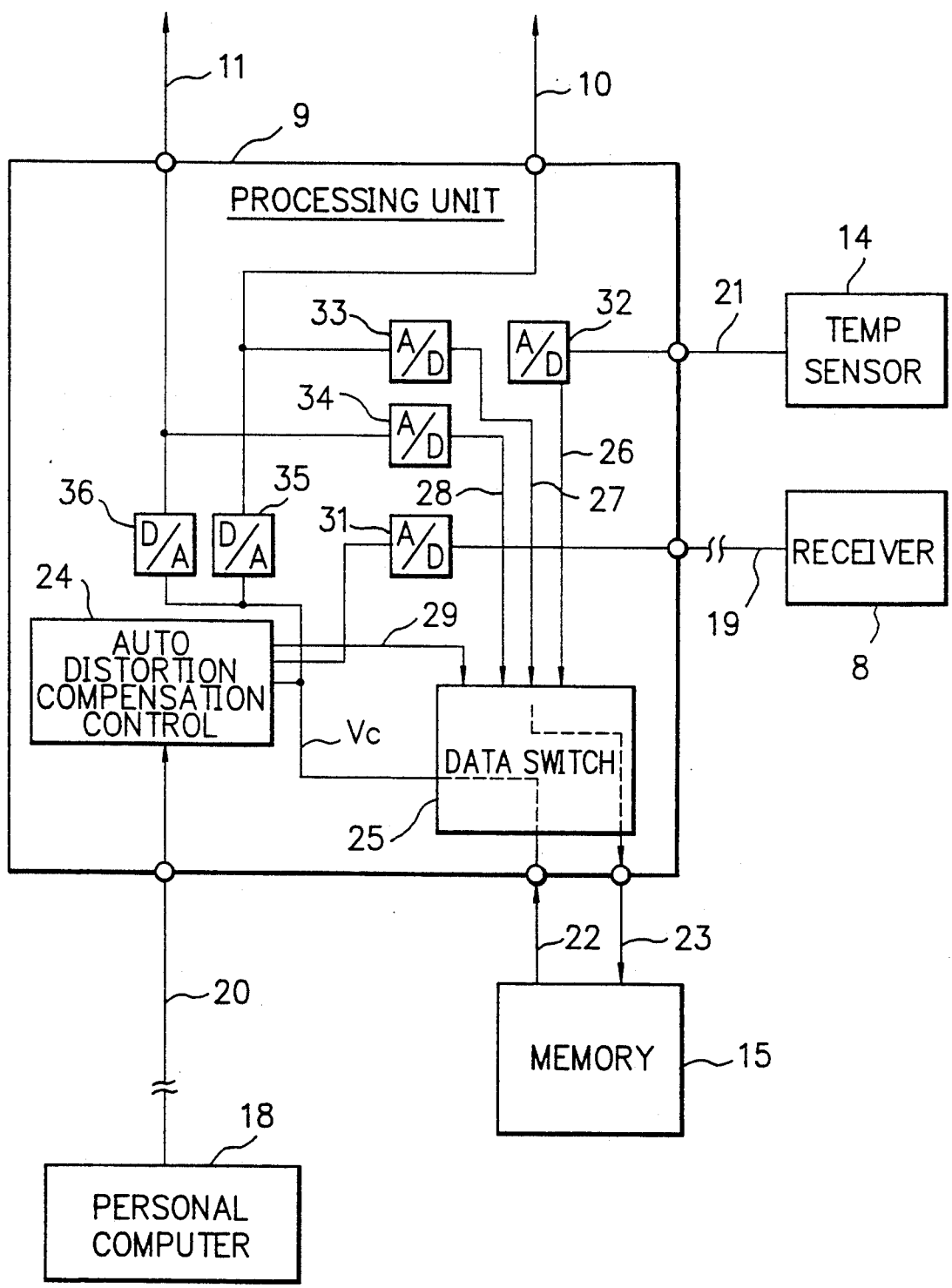
FIG. 4 is a block diagram of a processing unit shown in FIG. 3.

The present invention will now be described in connection with its preferred embodiment with reference to the accompanying drawings, wherein the same parts as those described above in connection with the conventional embodiment are designated by the same reference characters and thus the repeated description thereof can be omitted for brevity. In FIGS. 3 and 4, there is shown one embodiment of a linear amplifier performing a distortion compensation control according to the present invention.

As shown in FIG. 3, the linear amplifier comprises an input terminal 1 for a plurality of composite carriers, a power amplifier 5, a distorter 4 for generating an intermodulation distortion with an equal amplitude of an antiphase for negating an intermodulation distortion generated by the power amplifier 5, an output terminal 7 for a carrier power-amplified by the power amplifier 5, a temperature sensor 14 for detecting an ambient temperature to output a temperature detection voltage 21, a memory 15 for storing correction data or optimum intermodulation distortion control voltage data 22 of a deterioration amount of the intermodulation distortion caused by a variation of an operating area of the power amplifier 5 due to a temperature change or other factors, and a processing unit 9 which outputs an attenuation value control voltage 10 and a phase control voltage 11 for controlling an amplitude amount and a phase amount of the intermodulation distortion with the equal amplitude of the antiphase depending on the temperature detection voltage 21 and the optimum intermodulation distortion control voltage data 22 to the distorter 4. This linear amplifier can be contained in a thermostat chamber 17. The processing unit 9 can be controlled by an external personal computer 18 which outputs a distortion compensation start signal 20 to the processing unit 9.

A pilot oscillator 2 generates a two waves pilot signal to be used for monitoring an intermodulation distortion component of the power amplifier 5 to the input terminal 1. A detector 6 detects the intermodulation distortion at the output terminal 7, and a receiver 8 receives the intermodulation distortion component detected by the detector 6 and converts it into a DC voltage to output an intermodulation distortion detection voltage 19 to the processing unit 9. A terminating variable resistor 16 is connected to the detector 6.

In FIG. 4, there is shown one embodiment of the processing unit 9. The processing unit 9 includes an automatic distortion compensation controller 24, a data switch 25, four A/D (analog-digital) converters 31, 32, 33 and 34 and two D/A (digital-analog) converters 35 and 36.

Next, the operation of the above-described linear amplifier will now be described.

Figure 2A:
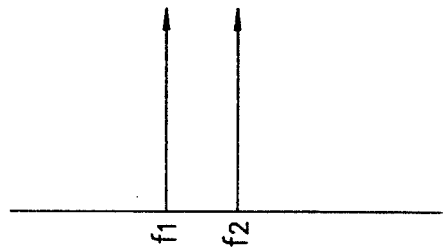
FIGS. 2A to 2D are graphical views showing spectra appearing in portions of the conventional linear amplifier shown in FIG. 1.
Figure 2B:
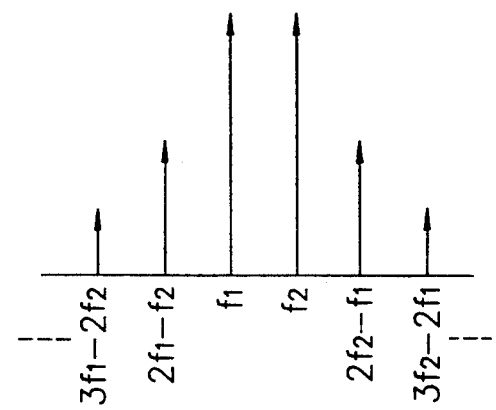
Figure 2C:
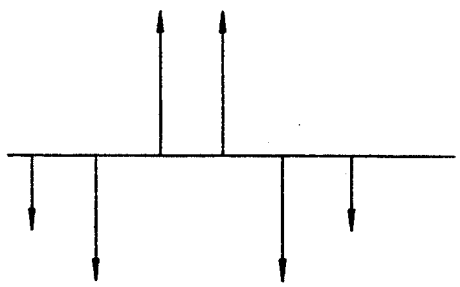
Figure 2D:
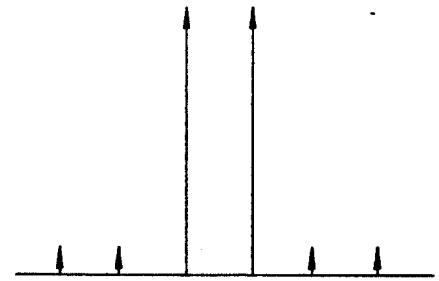

First, the processing unit 9 receives the temperature detection voltage 21 output from the temperature sensor 14 and the optimum intermodulation distortion control voltage data 22 corresponding thereto, output from the memory 15 and converts them into analog control voltages to output the attenuation value control voltage 10 and the phase control voltage 11 to the distorter 4. A plurality of carriers input from the input terminal 1 are fed to the distorter 4, and the carriers are added with the intermodulation distortion corresponding to the control voltages applied in the distorter 4 to output the obtained carriers to the power amplifier 5. In this case, as described above, since the intermodulation distortion with the equal amplitude of the antiphase with respect to the intermodulation distortion generated by the power amplifier 5 is generated in the distorter 4, the intermodulation distortion generated in the power amplifier 5 and the intermodulation distortion generated in the distorter 4 are canceled each other at the output terminal 7 to largely reduce the intermodulation distortion to obtain the spectrum wave, as shown in FIG. 2D.

Figure 1:
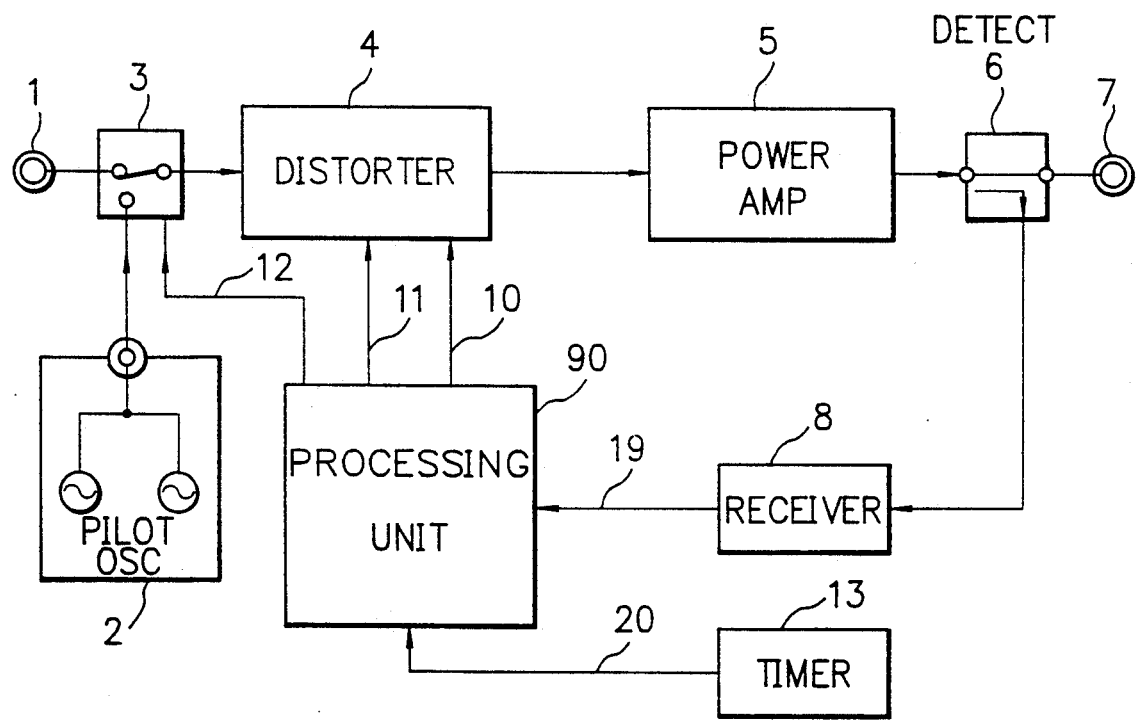
FIG. 1 is a block diagram of a conventional linear amplifier having a distortion compensation system.

Now, a data input method in the memory 15 will be described. The data inputting can be carried out in the linear amplifier having a simulated conventional structure, as shown in FIG. 1. At this time, the linear amplifier is constructed within a thermostat chamber 17 capable of changing the temperature in any stages between the maximum and minimum operating temperatures.

First, the temperature of the thermostat chamber 17 is kept to a fixed value, and, after the temperature of the linear amplifier is raised to be equal to that of the thermostat chamber 17 by sufficiently applying a current to the linear amplifier, a plurality of carriers are input to the linear amplifier from the pilot oscillator 2 so as to perform the power amplification of the carriers. Then, the amplified carriers are sent to the terminating variable resistor 16 through the detector 6 to terminate it. At this time, the receiver 8 receives the intermodulation distortion component detected by the detector 6 and outputs the intermodulation distortion detection voltage 19 to the processing unit 9.

Figure 5:
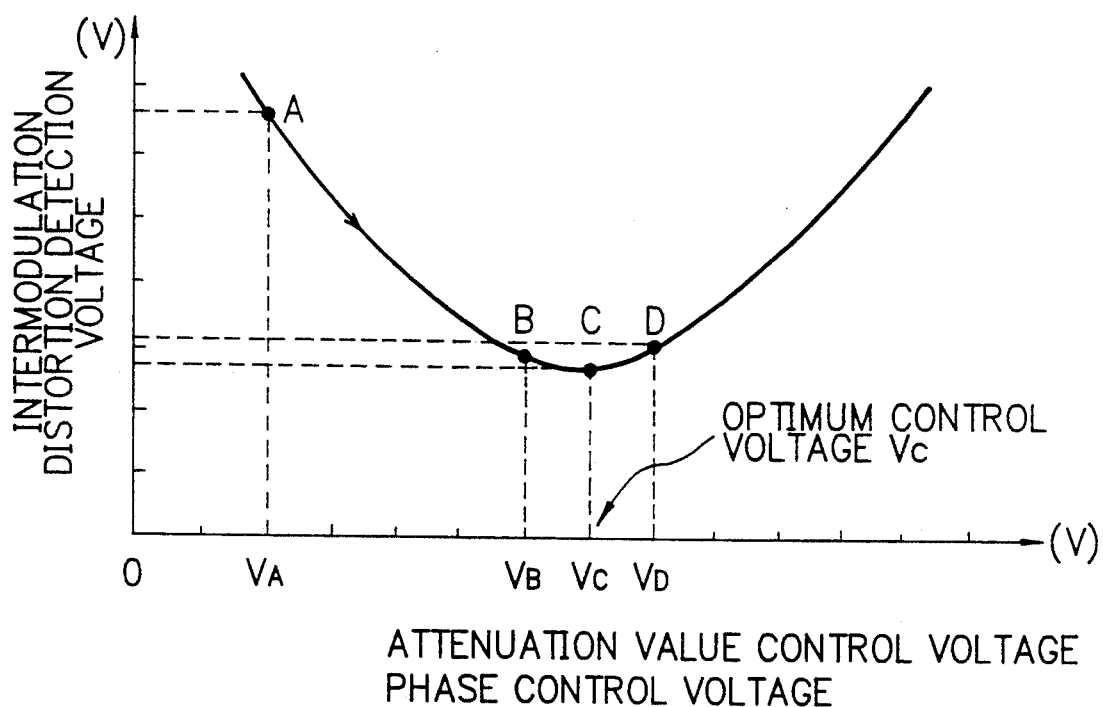
FIG. 5 is a graphical view showing a relationship between an attenuation value control voltage and a phase control voltage to be fed to a distorter with respect to an intermodulation distortion detection voltage according to the present invention.

Then, the detailed description of the processing unit 9 will be described in connection with FIGS. 4 and 5. When the processing unit 9 receives the distortion compensation start signal 20 output from the external personal computer 18, the processing unit 9 starts the inputting operation of the distortion compensation data. The intermodulation distortion detection voltage 19 detected in the receiver 8 is fed to the automatic distortion compensation controller 24 via the A/D converter 31. The automatic distortion compensation controller 24 outputs the data for changing the attenuation value control voltage 10 and the phase control voltage 11 in certain steps in order to obtain the control voltage so that the intermodulation distortion detection voltage 19 may be the minimum. FIG. 5 represents an automatic distortion compensation control process. At this time, as shown in FIG. 5, detection voltages A, B, C and D satisfy a relation of A>B (and D)>C. The obtained optimum control voltage Vc is sent to the data switch 25. The temperature detection voltage 21 is converted in the A/D converter 32 and the obtained data 26 are input to the data switch 25. In response to a data switch signal 29 for representing a distortion compensation control finish, output from the automatic distortion compensation controller 24, the data switch 25 outputs the data to the memory 15. In the memory 15, by using EEPROMs (electrically erasable programmable read-only memories) or the like, the data inputting can be carried out as these are mounted. As to the data to be stored in the memory 15, attenuation control voltage data 27 obtained by converting the attenuation value control voltage 10 in the A/D converter 33 and phase control voltage data 28 obtained by converting the phase control voltage 11 in the A/D converter 34 as the optimum distortion compensation data at the temperature are sent through a data write signal line 23 to the memory 15 and are stored into the memory 15 by using the data 26 obtained by converting the temperature detection voltage 21 in the A/D converter 32 as addresses.

The similar operation is repeated while the temperature of the thermostat chamber 17 is varied. The obtained data to be stored in the memory 15 are shown in Table 1.

TABLE 1

| Ambient temp. | ROM address | A.C.V. | Data 28 | P.C.V. | Data 27 |
|---|---|---|---|---|---|
| 15° C. | 00 | 1.2 V | 11 | 5.5 V | EE |
| 30° C. | 1F | 3.5 V | 3B | 4.2 V | B0 |
| 45° C. | 5B | 4.8 V | B5 | 2.2 V | 33 |
| 60° C. | FF | 5.8 V | FF | 1.0 V | 00 |

A.C.V.: Attenuation value control voltage
P.C.V.: Phase control voltage

At the operation time, by changing the data switch signal 29, the optimum intermodulation distortion control voltage data 22 are extracted from the memory 15 storing the control voltage data in the predetermined temperature range and are converted in the D/A converters 35 and 36 to output the attenuation value control voltage 10 and the phase control voltage 11 to the distorter 4. As a result, the control voltage values adapting to the ambient temperature can be continuously applied to the linear amplifier from the memory 15, and therefore the linear amplifier can keep to continue the stable class A operation.

As described above, according to the present invention, by providing a memory for storing optimum distortion compensation values considering a deterioration amount against a temperature change of an intermodulation distortion generated in a power amplifier, in place of a conventional discontinuous distortion compensation control including a line cut, a continuous distortion compensation control having no line cut and less deterioration with the passage of time can be carried out, and by providing a feedback loop, a conventional complicated and high cost system construction can be changed to a simple and low cost construction.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A predistortion linear amplifier, comprising:
   power amplifier means for performing a linear amplification of a plurality of carriers and generating a first intermodulation distortion;
   distorter means for generating a second intermodulation distortion with an equal amplitude of an antiphase with respect to the first intermodulation distortion generated by the power amplifier means;
   processing unit means for outputting a control signal for controlling an amplitude amount and a phase amount of the second intermodulation distortion generated by the distorter means;
   temperature sensor means for detecting an ambient temperature to output temperature information; and
   memory means for storing a plurality of control voltages having optimum distortion compensation values depending on the ambient temperatures,
   the processing unit means reading a corresponding control voltage out of the memory means depending on the temperature information output by the temperature sensor means and outputting the read control voltage as the control signal to the distorter means.

2. The predistortion linear amplifier as claimed in claim 1, wherein the processing unit means includes:
   an automatic distortion compensation controller for obtaining the optimum control voltages; and
   a data switch for outputting the optimum control voltages to the memory means.

3. The predistortion linear amplifier as claimed in claim 2, wherein the processing unit means includes:
   analog-digital converter means for converting analog control voltages into digital control data to be sent to the data switch; and
   digital-analog converter means for converting the digital control data output from the automatic distortion compensation controller.

* * * * *